(12) United States Patent
Ramaraju et al.

(10) Patent No.: US 7,843,218 B1
(45) Date of Patent: Nov. 30, 2010

(54) DATA LATCH WITH STRUCTURAL HOLD

(75) Inventors: Ravindraraj Ramaraju, Round Rock, TX (US); David R. Bearden, Austin, TX (US); Cody B. Croxton, Austin, TX (US); Prashant U. Kenkare, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/607,657

(22) Filed: Oct. 28, 2009

(51) Int. Cl.
*H03K 19/173* (2006.01)
(52) U.S. Cl. .............................. 326/46; 326/93; 326/38
(58) Field of Classification Search ............ 326/37–41, 326/46, 93–98; 714/724–731
See application file for complete search history.

(56) References Cited

U.S. PATENT DOCUMENTS

| | | | |
|---|---|---|---|
| 5,920,575 A * | 7/1999 | Gregor et al. ............... | 714/726 |
| 6,389,566 B1 | 5/2002 | Wagner et al. | |
| 6,895,540 B2 | 5/2005 | Chen et al. | |
| 7,345,519 B2 | 3/2008 | Hirata | |
| 7,436,211 B2 * | 10/2008 | Ueda ........................... | 326/46 |
| 7,484,149 B2 * | 1/2009 | Lackey ........................ | 714/726 |
| 7,596,732 B2 | 9/2009 | Branch et al. | |
| 2008/0012618 A1 | 1/2008 | Ramaraju et al. | |
| 2008/0284480 A1 | 11/2008 | Ahmadi | |

* cited by examiner

*Primary Examiner*—Don P Le
(74) *Attorney, Agent, or Firm*—Hamilton & Terrile, LLP; Michael Rocco Cannatti

(57) ABSTRACT

A multiplexed data flip-flop circuit (500) is described in which a multiplexer (510) outputs functional or scan data, a master latch (520) generates a master latch output signal at a hold time under control of a master clock signal, a slave latch (540) generates a flip flop output signal at a launch time under control of a slave clock signal, clock generation circuitry (550) generates a second clock signal that has a DC state during a functional mode and has a switching state during a scan mode, and data propagation logic circuitry (564) uses the first and second clock signals to generate the master and slave clock signals during a scan mode to delay the launch time of the slave latch with respect to the hold time of the master latch.

20 Claims, 10 Drawing Sheets

DATA LATCH WITH STRUCTURAL HOLD

BACKGROUND OF THE INVENTION

1. Field of the Invention

The present invention is directed in general to the field of electronic circuits. In one aspect, the present invention relates to a data latch apparatus and system for transferring data in a datapath and methods for operating same.

2. Description of the Related Art

In electronic circuits and data processing systems, flip-flops are commonly used in digital circuits for propagating data through various datapaths. Such flip-flops typically consist of master and slave latches, each of which uses its own clock for receiving data inputs and propagating data within the circuit/system. For example, the master latch captures input data during assertion of the capture clock, while the slave latch launches data during assertion of the launch clock. Testability typically requires the flip-flop to have an additional circuit portion that allows multiple flip-flops to be connected into a serial scan register chain for loading and unloading test vectors to distinguish between functional and test modes. Proper operation during either functional or test modes requires that the input data be stable for a predetermined time commonly known as the "hold time" of the flip-flop. In modern systems, hold violations are most pervasive in datapaths that have minimal logic between pairs of flip-flops. It is generally accepted that serial scan register chains are susceptible to hold violations because there is minimal logic between pairs of flip-flops that are serially coupled to each other.

Level-sensitive scan design (LSSD) includes an additional test clock input that is used for capturing data into the master latch. Hence, an LSSD flip-flop can be considered to have three clocking inputs: A clock, B clock, and C clock. The master latch has at least one data port for receiving functional data when its LSSD C clock is active, and also has at least one data port for receiving scan data when its LSSD A clock is active. In addition, the slave latch has at least one data port for receiving data from the master latch when the LSSD B clock is active. During test operations, the two latches form a master/slave pair with one scan input, one scan output, and non-overlapping scan clocks A and B which are held low during functional operation, but which cause the scan data to be latched when pulsed high during scan operation. The LSSD A clock can be independently controlled relative to the LSSD B clock, and their non-overlap can be designed such that hold violations are not a problem in test mode. However, a disadvantage with LSSD flip-flops is that the B and C clocks are both high-speed clocks which toggle during functional mode. In addition to the increased system complexity of providing two high-speed clocks, the LSSD approach also requires higher clocking power in functional mode.

To reduce the number of clock signals required, single clocked multiplexed data flip-flop (Mux-D FF) designs have been proposed for use with scan/test designs so that only a single clock is used for functional and scan modes. Referring to FIG. 1, an example Mux-D FF design is shown in which a storage cell 140 has only one clock 131 input to its L1 master latch 110 and L2 slave latch 120. FIG. 2 is a timing diagram of the clock signals for implementing the Mux-D FF shown in FIG. 1, with CLOCKB 202 representing an inverted version of the input CLOCK 201 which is applied as the input clock signal 131 to the inverter 130 to generate the CLOCKB signal. In this way, CLOCKB is provided as the clock signal 132 to the master latch 110 and CLOCK is provided as the clock signal 131 to the slave latch 120. The inverted input clock (CLOCKB) 132 is received at the L1 master latch 110 which also receives the data input 111 from a multiplexer 100 which selects between D functional data 101 and I scan data 102 based on the scan enable (SE) selection signal 103. The output of the Mux-D FF storage cell 140 appears at Q output line 123 from the L2 slave latch 120. While the Mux-D FF uses only a single input clock 131 for the storage cells 110, 120, data cannot be flushed through the scan path 102, 111, 121, 123 (for system reset or manufacturing test). In addition, the data path delay (both functional data path 101, 111, 121, 123 and scan path 102, 111, 121, 123) must be long enough to avoid timing problems due to clock skew which results from the difference in arrival time of the clock signal 131 at different latches or flops 110, 120. Such clock skew is difficult to control due to the nature of the clock tree distribution and design with existing chip system designs, and as a result, a clock skew with value of 150 ps is not uncommon. Such clock skew is significant and can result in hold time violations during scan mode. To address hold time violations, buffers or delay elements have conventionally been inserted between the out and scan-in port of the next flip-flop, but this additional circuitry increases the circuit area size and consumes additional power.

Accordingly, a need exists for an improved data latch, system and method of operations that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
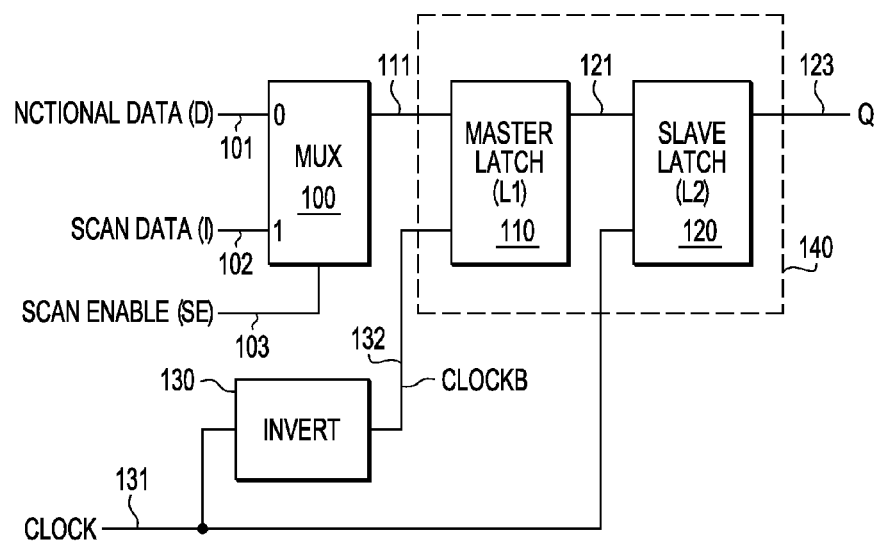
FIG. 1 is a logic diagram of a multiplexed data flip-flop.
Figure 2:
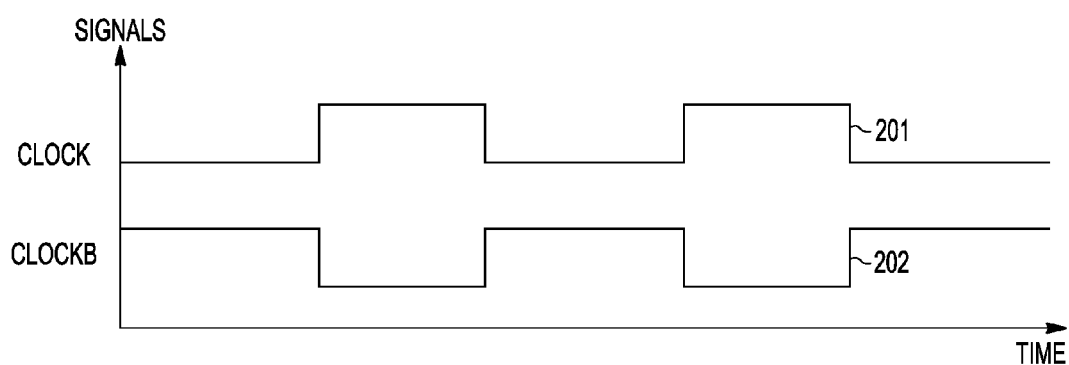
FIG. 2 is a timing diagram of the clock signals for implementing the multiplexed data flip-flop shown in FIG. 1.

A multiplexed flip-flop with built-in structural hold and associated methodology of operation are described in connection with a separately clocked multiplexed data flip-flop which provides a Mux-D flip-flop behaviour during the functional mode and LSSD behaviour during the scan mode. To this end, an input clock signal that used for both functional and scan modes is used to generate a second clock that is a DC state during the functional mode and that switches during the scan mode. In the described embodiments, such an approach eliminates the need for hold buffers to fix hold violations in the scan path. In selected embodiments, the input clock signal and its inverse are applied to clock the master and slave latches during functional mode, but during scan mode, the input clock signal is used to generate a separate slave clock such that launch of the slave latch is substantially delayed with respect to the data capture by the master latch. In other embodiments, the input clock signal and its inverse are applied to clock the master and slave latches during functional mode, but during scan mode, the input clock signal is used to generate a separate master clock such that the capture of incoming scan data is substantially advanced with respect to the launch of the slave latch, thereby significantly decreasing the hold time requirement for incoming scan data. In yet other embodiments, the input clock signal and its inverse are applied to clock the master and slave latches during functional mode, but during scan mode, the input clock signal is used to generate separate master and slave clocks so that the hold time of the master latch is separated from the launch of the slave latch. The disclosed data latch with structural hold provides the full capabilities of both Mux-D FF and LSSD scan methodologies without requiring buffers/delay elements to address clock skew.

Various illustrative embodiments of the present invention will now be described in detail with reference to the accompanying figures which illustrate functional and/or logical block components and various processing steps. It should be appreciated that such block components may be realized by any number of hardware, software, and/or firmware components configured to perform the specified functions. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected embodiments of the present invention are implemented, for the most part, with electronic components and circuits known to those skilled in the art, and as a result, circuit details have not been explained in any greater extent since such details are well known and not considered necessary to teach one skilled in the art of how to make or use the present invention. In addition, selected aspects are depicted with reference to simplified circuit schematics, logic diagrams, and flow chart drawings without including every circuit detail or feature in order to avoid limiting or obscuring the present invention. Such descriptions and representations are used by those skilled in the art to describe and convey the substance of their work to others skilled in the art.

Figure 3:
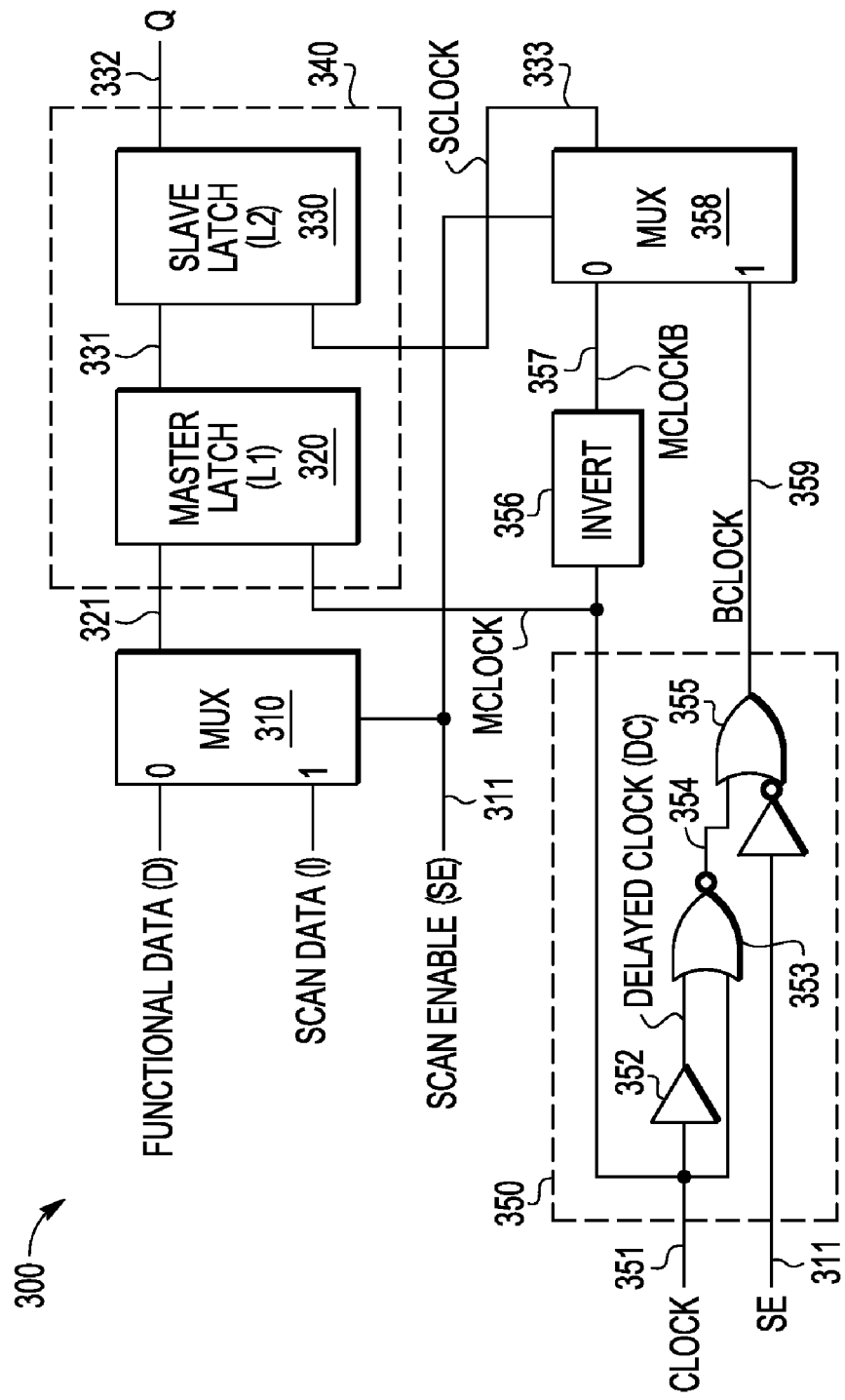
FIG. 3 a logic diagram of a multiplexed flip-flop with built-in structural hold in accordance with selected embodiments of the invention.

Turning now to FIG. 3, there is depicted a multiplexed flip-flop 300 in which a storage cell 340 is separately clocked with a master clock MCLOCK and a slave clock SCLOCK that are applied to the L1 master latch 320 and L2 slave latch 330, respectively. In the depicted flip-flop 300, the slave latch 330 is transparent when the clock signal 351 is low (and inverted by inverter 356), and the master latch 320 is transparent when the clock signal 351 is high, resulting in a negative edge triggered flip-flop implementation whereby the flip-flop output Q 332 changes when the clock signal 351 falls. However and as described herein, selected embodiments of the present invention may also be implemented as positive edge flip-flops by adjusting the clock generation circuitry. The multiplexed flip-flop 300 includes an input multiplexer 310 for choosing between functional data input D and scan data input I based on a control input scan enable SE 311. The multiplexer 310 conveys the chosen input to the multiplexer output 321 which is connected to the L1 master latch 320 which is clocked by the input master CLOCK signal (or MCLOCK) on line 311. In turn, the output 331 of the L1 master latch 320 is connected to the data input of the L2 slave latch 330 which is clocked with the output 333 of the slave clock multiplexer 358 to launch output data Q on the output 332.

As shown in FIG. 3, the input clock signal CLOCK 351 is applied directly as the master clock MCLOCK to the L1 master latch 320 for both functional and scan modes. However, the slave clock SCLOCK for the L2 slave latch 330 is generated by the slave clock multiplexer 358 which, based on a control input scan enable SE 311, chooses between the multiplexer inputs 357, 359. The first multiplexer input 357 is an inverted master clock MCLOCK (MCLOCKB) that is generated by the inverter 356. The other multiplexer input 359 is a second clock signal BCLOCK that is generated by a clock or pulse generator circuit 350. The clock/pulse generator circuit 350 includes logic gate and inverter circuits for generating the second clock signal BCLOCK that has a DC state during the functional mode, and that switches during the scan mode to have rising edges that are delayed with respect to the falling edges of the input clock signal CLOCK. In an example implementation, the clock/pulse generator circuit 350 includes an NOR gate 353 which receives the input clock signal CLOCK and the delayed version of the input clock signal CLOCK generated by the delay element 352, and generates therefrom a pulse signal which is applied as an input 354 to the OR gate 355 which also receives an inverted version of the scan enable SE 311. Based on these inputs, the OR gate 355 generates the second clock signal BCLOCK 359.

Figure 4:
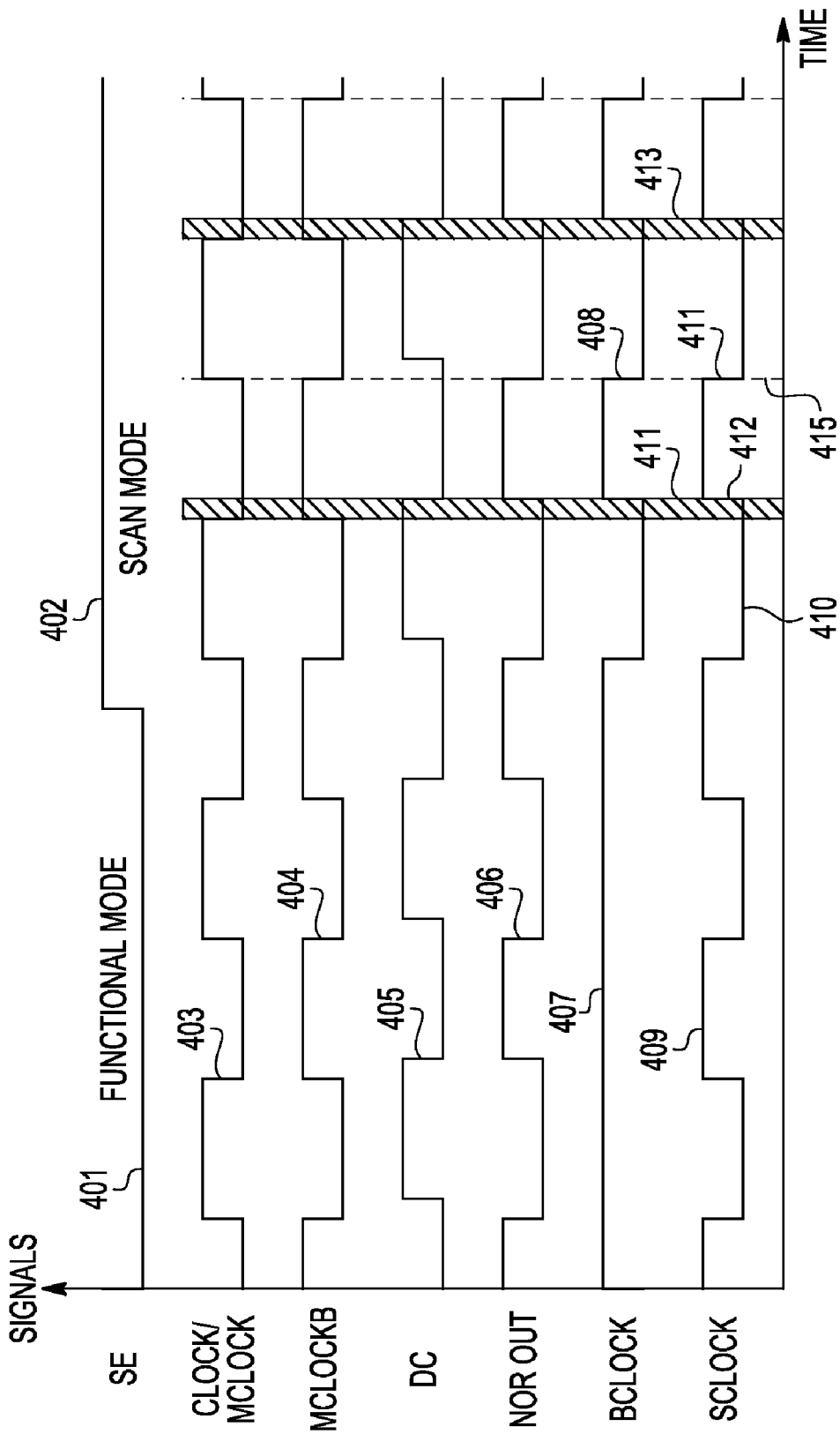
FIG. 4 is a timing diagram of the clock signals for implementing the multiplexed flip-flop shown in FIG. 3.

As shown with the timing diagram depicted in FIG. 4, the disclosed clock/pulse generator circuit 350 uses the delay element 352 to generate a delayed clock signal (DC) 405 which is a delayed version of the input clock signal CLOCK 403. By combining the delayed clock signal DC 405 with the input clock signal CLOCK 403 at the NOR gate 353, the resulting pulse signal 406 has rising edges that are delayed with respect to the falling edges of the input clock signal CLOCK 403, and has falling edges that coincide with the rising edges of the input clock signal CLOCK 403. In this way, the delay may be controlled to correspond to the maximum clock skew that is caused by process variations. The pulse signal 406 output by the NOR gate 353 is effectively filtered by the OR gate 355 which also receives the inverted scan enable signal 311. Thus, during functional mode when the SE signal 401 is "low," the OR gate 355 turns the second clock signal BCLOCK 407 "high" since the inverted version of the "low" SE signal 401 is "high," forcing the output of the OR gate 355 to be "high." In contrast, during scan mode when the SE signal 402 is "high," the second clock signal BCLOCK 408 generated by the OR gate 355 follows the pulse signal 354 from the NOR gate 353 so that the second clock signal BCLOCK 408 follows the input clock signal 403 with a predetermined delay offset.

As depicted in FIGS. 3 and 4, the input clock signal CLOCK 403 from the clock/pulse generator circuit 350 is applied as the master clock MCLOCK to clock the master latch 320 during both functional and scan modes. In addition, the slave clock multiplexer 358 generates the slave clock SCLOCK 409 by choosing between the inverted input clock MCLOCKB 404 at mux input 357 and the second clock signal BCLOCK 407 at mux input 359 based on the control input scan enable SE 401, 402. Thus, during functional mode (when the SE signal 401 is "low"), the multiplexer 358 chooses the inverted input clock MCLOCKB 404 as the slave clock output SCLOCK 409, but during scan mode (when the SE signal 402 is "high"), the multiplexer 358 chooses the second clock signal BCLOCK 408 as the slave clock output SCLOCK 410 with a predetermined delay offset 411, 413. The first delay offset 411 represents the delay from the closing of the master latch 320 (at the falling edge of the input/master clock MCLOCK 403) to the launch of the slave latch 330 (at the rising edge of the slave clock SCLOCK 412) for outputting data Q on the output 332. When the second clock signal BCLOCK 408 is "high," the master latch 320 is closed while the slave latch 330 is open to launch data until the time indicated at line 415 when the slave latch 330 closes and the master latch 320 simultaneously opens.

While the specific circuitry of the clock/pulse generator circuit 350 may vary, its purpose is to generate a delayed version of normal slave clock signal during scan mode so that the launch of the slave latch is delayed with respect to the close of the master latch. Thus, the clock/pulse generator circuit 350 generates separate clock signals to provide the multiplexed flip-flop 300 with a high tolerance for clock skew between the high speed master clock signal MCLOCK 403 and the relatively lower speed slave clock signal 410. In this way, the high speed input clock signal 403 may be applied to clock the master latch for both functional and scan modes. During functional mode, the high speed inverted input clock CLOCKB 404 is applied as the slave clock signal SCLOCK 409, but during scan mode, a second lower speed delayed clock signal BCLOCK 407 generated and applied to clock the scan-out port of the flip-flop. The significantly delayed scan-out is now unlikely to violate the hold requirements of a receiving flip-flop thus eliminating the need to insert hold buffers.

Figure 5:
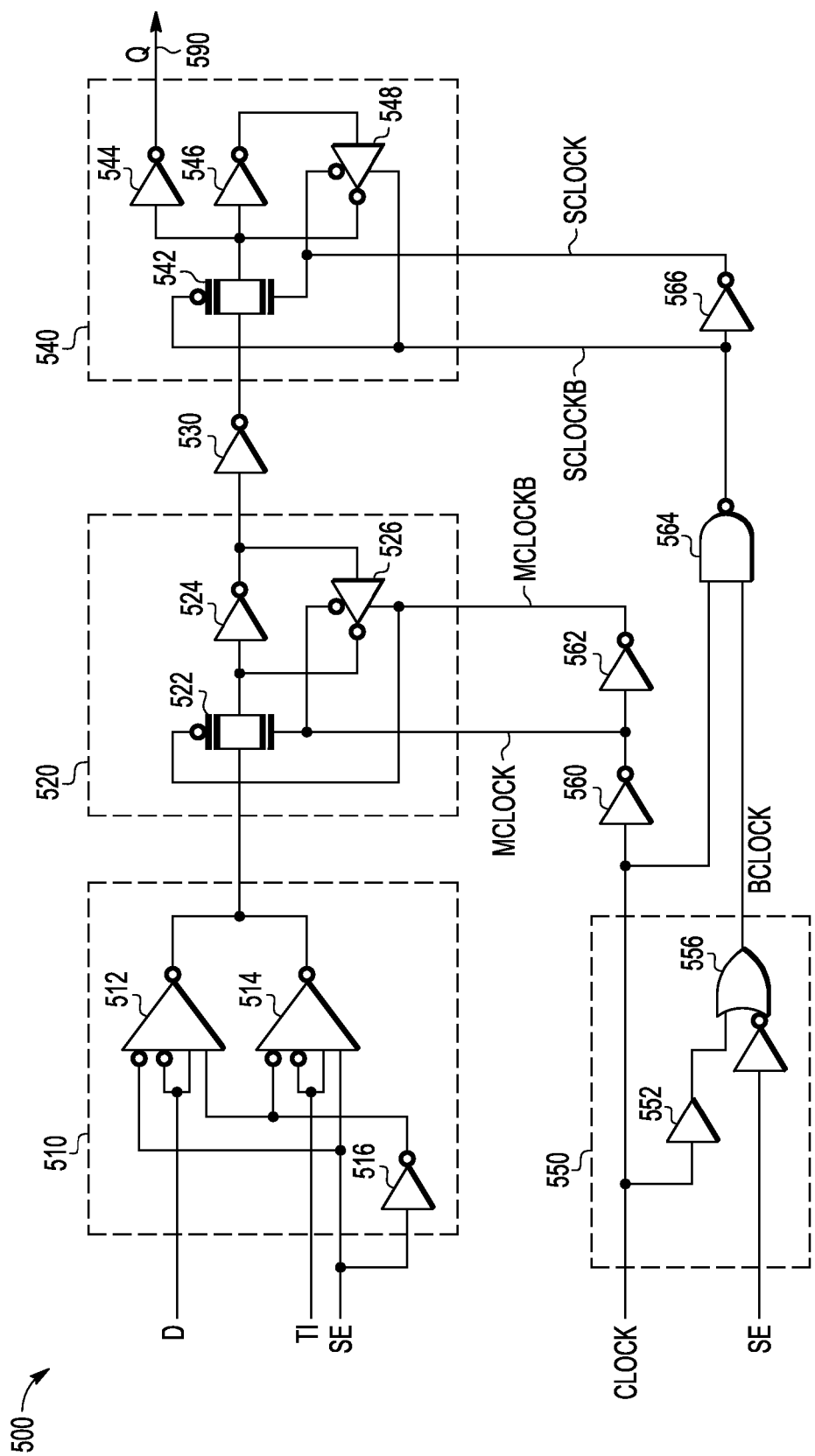
FIG. 5 is a schematic circuit diagram of a multiplexed data flip-flop which has a separately clocked slave latch.

FIG. 5 is a schematic circuit diagram of a multiplexed data flip-flop 500 formed with a separately clocked master latch 520 and a slave latch 540, where the master latch 520 is clocked with a first clock pair MCLOCK, MCLOCKB and the slave latch 540 is separately clocked with a second clock pair SCLOCK, SCLOCKB. In the depicted flip-flop 500, a positive edge triggered implementation is provided where the slave latch 540 is separately clocked by the clock regenerator circuitry 550. As will be appreciated, the multiplexed data flip-flop 500 may be included as one of a plurality of flip-flops in a datapath, where each flip-flop is operable to receive a data input D and to generate a data output Q therefrom. With the separated master and slave clocking scheme described herein, the multiplexed data flip-flop is able to internally hold data with a simple interlocking gate so that hold time violations during scan mode can be avoided, thereby avoiding the need to insert buffers between the flip-flop output port and the scan-in port of the next flip-flop.

In operation, the multiplexed data flip-flop 500 latches functional data D or scan data TI into master and slave latches under control of a scan enable signal SE using a single input clock CLOCK to generate separate master and slave clock signals. To choose between the input functional data D and scan data TI, the multiplexer 510 includes a functional data inverter 512, scan data inverter 514, and scan control signal inverter 516. The multiplexer input lines include scan data TI, scan enable SE, and function data D. Scan data TI is fed to the inputs of the scan data inverter 514 as shown, and functional data D is fed to the inputs of the functional data inverter 512 as shown. To control the multiplex select function, the scan enable signal SE is fed, along with its inverse, to both the functional data inverter 512 and scan data inverter 514. In addition, the scan enable signal SE may be inverted at inverter 516 and then fed, along with its inverse, to the functional data inverter 512 and scan data inverter 514. The outputs of the functional data inverter 512 and scan data inverter 514 are tied together to form the output of the multiplexer 510 which is fed to the master latch 520. In this way, the multiplexer 510 selects between functional data D and scan data TI based on the scan enable (SE) selection signal.

The master latch 520 includes a transmission gate 522 which may be formed by source-drain connecting a PMOS and NMOS transistor together in parallel so that the NMOS transistor is gated by the MCLOCK signal and the PMOS transistor is gated by the MCLOCKB signal. In this way, when the MCLOCK signal transitions to "high," the transmission gate 522 is turned on to allow data received from the multiplexer 510 to be passed as shown to a storage node formed with inverters 524, 526. Inverter 530 buffers the storage node and provides the data as an input to the slave latch 540.

The slave latch 540 includes circuitry that is similar to the master latch 520. In particular, the output from the inverter 530 is provided to the transmission gate 542 which may be formed by source-drain connecting a PMOS and NMOS transistor together in parallel so that the NMOS transistor is gated by the SCLOCK signal and the PMOS transistor is gated by the SCLOCKB signal. When the SCLOCK transitions to "high," the transmission gate 542 is turned on, thereby allowing data from the inverter 530 to be passed through the transmission gate 542 to be passed as shown to a storage node formed with inverters 546, 548. Inverter 544 inverts the data from the storage node to its original state to generate a data output signal Q on output line 590.

To separately clock the master and slave latches 520, 540, clock regenerator circuitry 550 is provided for generating (or passing) a first clock signal CLOCK and a second clock signal BCLOCK. These signals from the clock regenerator circuitry 550 are provided to data propagation logic circuitry 564 at the flip-flop 500 for generating a separate slave clock signal SCLOCK and SCLOCKB. As depicted, the clock regenerator circuitry 550 includes a delay element 552 which generates a delayed version of the input clock signal CLOCK which is applied as an input to the OR gate 556. The OR gate 556 also receives an inverted version of the scan enable SE, and generates therefrom the second clock signal BCLOCK. The first clock signal CLOCK from the clock regenerator circuitry 550 is inverted by the series-connected inverters 560, 562 to generate a first clock pair MCLOCK, MCLOCKB for clocking the master latch 520. However, to separately clock the slave latch 540, the clock regenerator circuitry 550 generates a second clock signal BCLOCK which is combined at the NAND gate 564 with the first clock signal CLOCK and then inverted by the inverter 566 to generate the second clock pair SCLOCK, SCLOCKB for clocking the slave latch 540. In this configuration, the NAND gate 564 acts as an interlocking gate during scan mode to combine the first clock signal CLOCK and the delayed second clock signal BCLOCK to generate the slave clock signal pair SCLOCK and SCLOCKB which clocks the slave latch 540 to avoid hold time violations.

Figure 6:
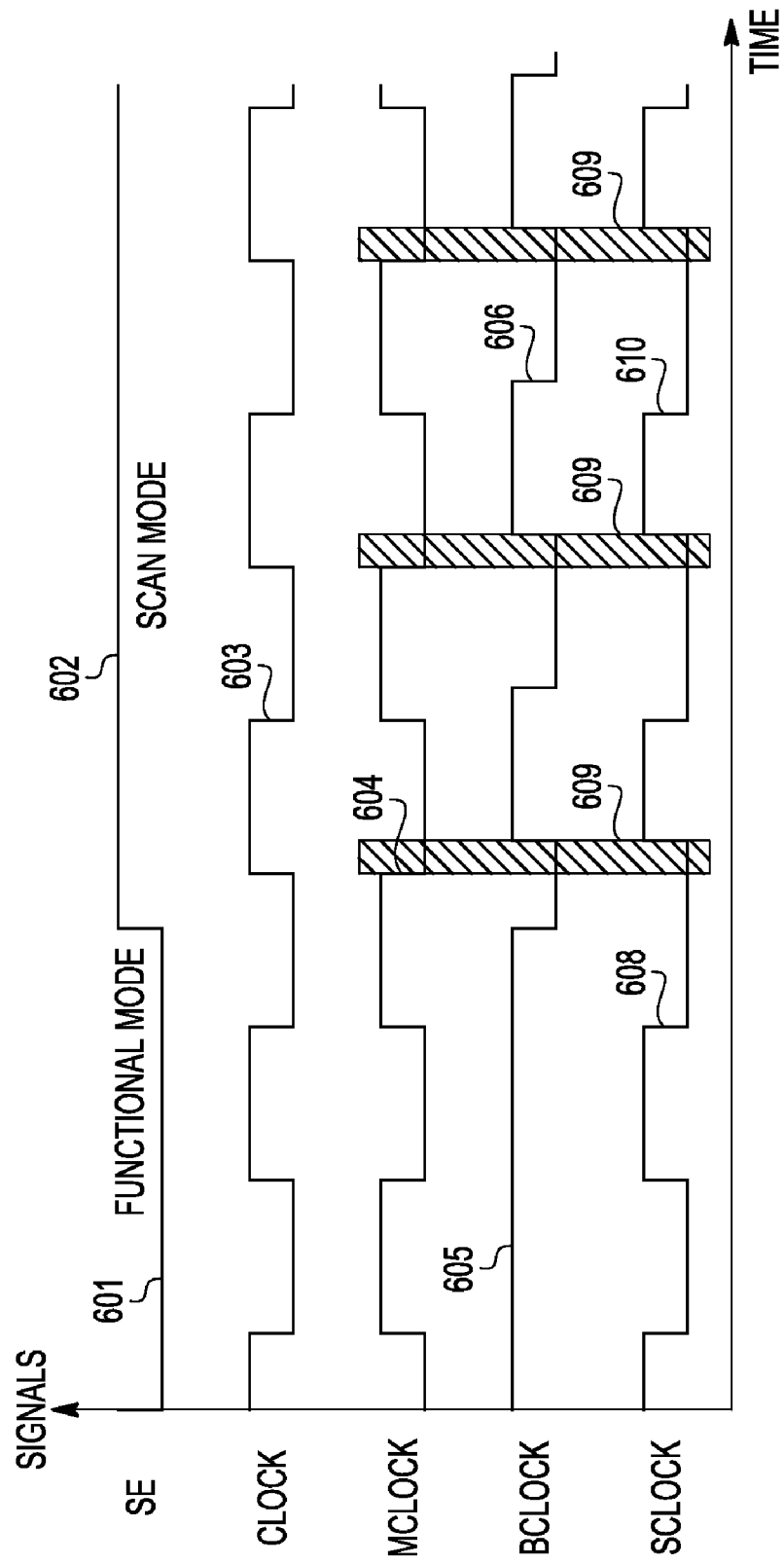
FIG. 6 is a timing diagram of the clock signals for implementing the multiplexed data flip-flop shown in FIG. 5.

During functional mode, the inverted scan enable SE signal holds the output of the OR gate 556 "high" so that the NAND gate 564 acts as an inverter. In this functional configuration, the input clock signal CLOCK is inverted at NAND gate 564 to generate the SCLOCKB signal, and is inverted again at the inverter 566 to generate the SCLOCK signal. The resulting signal generation during functional mode is shown with the timing diagram in FIG. 6. In particular, during functional mode when the SE signal 601 is "low," the OR gate 556 turns the second clock signal BCLOCK 605 "high." With the second clock signal 605 BCLOCK "high," the NAND gate 564 acts as an inverter so that the input clock signal CLOCK 603 is inverted to generate the slave clock signal SCLOCKB, which in turn is inverted by inverter 566 to generate the slave clock signal SCLOCK 608. At the same time, the input clock signal CLOCK 603 is inverted by the inverter 560 to generate the master clock signal MCLOCK 604, which in turn is inverted by inverter 562 to generate the inverted master clock signal MCLOCKB. As a result, when the input clock signal CLOCK 603 is "high," the slave latch 540 is transparent because the slave clock signal SCLOCK 608 is "high," but when the input clock signal CLOCK 603 is "low," the slave latch 540 is opaque because the slave clock signal SCLOCK 608 is "low." In this functional mode, data setup transitions in the master latch 520 (e.g., the falling edges of the master clock signal MCLOCK 604) occur at the same time as the data launch transitions in the slave latch 540 (e.g., the rising edges of the slave clock signal SCLOCK 608), in that both coincide with the rising edges of the input clock signal CLOCK 603.

To prevent hold time violations during scan mode that can be caused by the clock skew between the flip-flops, the clock regenerator circuitry 550 generates separate clock signals so that the master latch 520 and the slave latch 540 are separately clocked with two non-overlapping phases. In this case, first and second clock signals have non-overlapping phases if the rising and falling edges of the first clock signal do not both overlap with the corresponding rising and falling edges of the second clock signal. The separate clocks allow the master latch 520 to receive data from the multiplexer 510 in a first phase and then pass the data to the slave latch 540 in the second delayed phase. In this scan mode, the second clock signal BCLOCK 606 from the clock regenerator circuitry 550 follows the input clock signal CLOCK 603 with a predetermined delay offset 609 which is set by the delay element 552. As a result, the slave latch 540 is transparent only when the input clock signal CLOCK 603 and second clock signal BCLOCK 606 are both "high," as indicated in the scan mode portion 610 of the SCLOCK signal 610 in FIG. 6. As a result, the launch of the slave latch 540 is controlled by the second clock signal BCLOCK 610 during scan mode to be delayed with respect to data capture by the master latch 520 at the data setup transitions (e.g., falling edges) in the master clock signal MCLOCK 604. In other words, during scan mode, data setup transitions in the master latch 520 (e.g., the falling edges of the master clock signal MCLOCK 604) occur before the data launch transitions in the slave latch 540 (e.g., the rising edges of the slave clock signal SCLOCK 610) due to the delay provided by the delay buffer 552.

Figure 7:
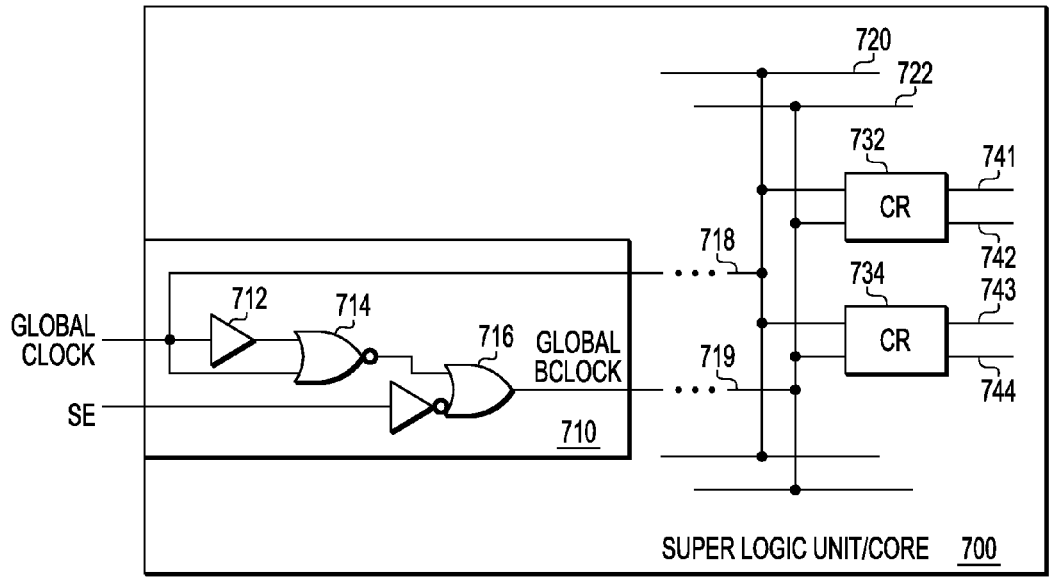
FIG. 7 is a diagram of a clock generator circuit that is shared across a plurality of clock trees in a defined circuit area.

In accordance with various embodiments, a variety of clock regeneration schemes may be employed to separately generate the master and slave clock signals for the multiplexed flip-flop structures described herein. For example, FIG. 7 depicts a diagram of a clock generator circuit 710 that is shared across a plurality of clock trees 720, 722 in a defined circuit area 700, such as a super logic unit or processing core. The depicted clock generator circuit 710 receives a master input signal GLOBAL CLOCK and a scan or test enable signal SE, and generates therefrom a second clock signal GLOBAL BCLOCK. To generate the second clock signal GLOBAL BCLOCK, the clock generator circuit 710 includes a NOR gate 714 which receives the input clock signal GLOBAL CLOCK and a delayed version of the input clock signal GLOBAL CLOCK (generated by the delay element 712), and generates therefrom a pulse signal which is applied as an input to the OR gate 716. The OR gate 716 also receives an inverted version of the test enable signal SE, and generates therefrom the second clock signal GLOBAL BCLOCK. In this arrangement, the clock generator circuitry 710 propagates the master clock signal GLOBAL CLOCK that transmitted over signal wire 718 to a first clock tree 720, and a second clock signal GLOBAL BCLOCK that is transmitted over a signal wire 719 to a second clock tree 722. It should be noted that signal wires 718, 719 may be designed to have substantially similar resistance and capacitance characteristics so as to ensure that signals GLOBAL CLOCK and GLOBAL BCLOCK have substantially similar propagation characteristics from the clock generator circuitry 710 to each clock tree 720, 722.

As will be appreciated, the defined circuit area 700 includes a plurality of multiplexed flip-flop structures (not shown) which are connected to form a datapath and which are clocked using the GLOBAL CLOCK and GLOBAL BCLOCK signals generated by the shared clock generator circuit 710. When the clock generator circuit 710 is shared across multiple clock trees 720, 722, the defined circuit area 700 may also include separate clock regenerator circuits 732, 734 for each clock tree. In this way, the first clock regenerator circuit 732 provides the high speed master clock signal CLOCK 741 and the low speed second clock signal BCLOCK 742 to an associated plurality of multiplexed flip-flop structures, while the second clock regenerator circuit 734 provides the high speed master clock signal CLOCK 743 and the low speed second clock signal BCLOCK 744 to an associated plurality of multiplexed flip-flop structures.

During scan mode, the second clock signal BCLOCK is a time-shifted and inverted version of the master clock signal CLOCK, where the time shift is determined by the delay element 712. In an example implementation where the delay element 712 provides a delay of 1.5 ns and the CLOCK and BCLOCK signals are used to separately clock the master and slave latches during scan mode as described herein, the resulting offset between the CLOCK and BCLOCK signals provides high tolerance for clock skew between the first and second clock trees 720, 722 as high as 1 ns±250 ps. As a result, the master latch is able to close and hold its data before the slave latch opens to launch its data, even when there is skew between the CLOCK and BCLOCK signals up to the predetermined delay amount.

Figure 8:
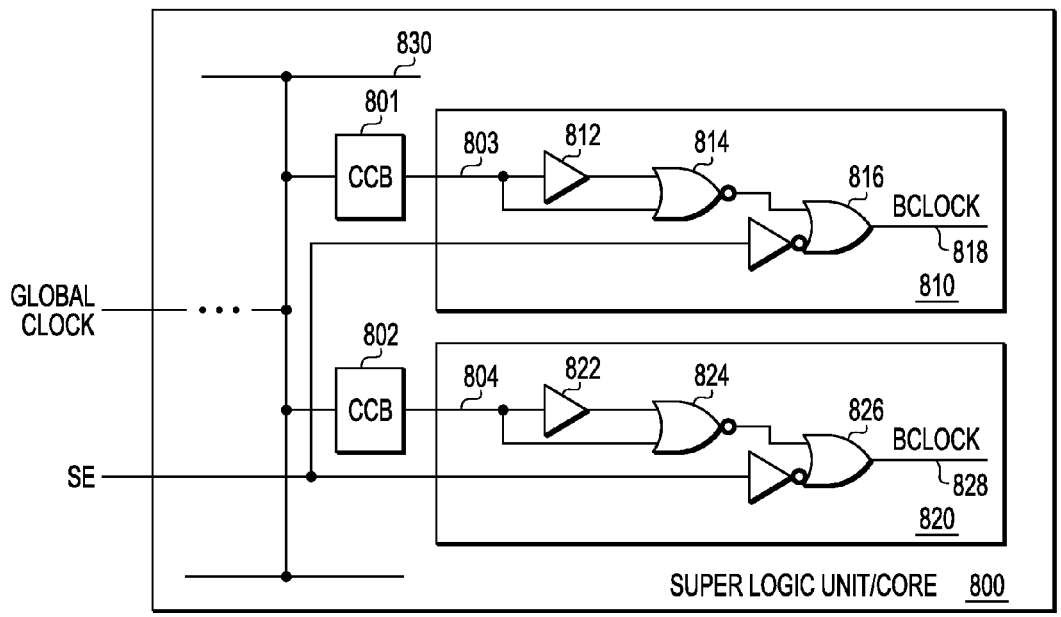
FIG. 8 is a diagram of a plurality of clock generator circuits that are used with a single clock tree in a defined circuit area.

Another clock regeneration scheme is shown in FIG. 8 depicts a diagram of plurality of clock generator circuits 810, 820 that are used with a single clock tree 830 in a defined circuit area 800, such as a super logic unit or processing core. Each depicted clock generator circuit 810, 820 may have a dedicated clock control block (CCB) 801, 802 at the input which receives the master input signal GLOBAL CLOCK and generates therefrom a locally regenerated input clock signal CLOCK 803, 804 for the clock generator circuit 810, 820. In this way, each clock generator circuit 810, 820 may be provided as a separate clock regenerator circuit that receives a master input signal CLOCK and a test enable signal SE, and generates therefrom a second clock signal BCLOCK. To generate the second clock signal BCLOCK, each clock generator circuit (e.g., 810) includes a NOR gate 814 which receives the input clock signal CLOCK 803 and a delayed version of the input clock signal CLOCK (generated by the delay element 812), and generates therefrom a pulse signal which is applied as an input to the OR gate 816. The OR gate 816 also receives an inverted version of the test enable signal SE, and generates therefrom the second clock signal BCLOCK. In this arrangement, each clock generator circuitry 810, 820 generates the second clock signal BCLOCK that is transmitted over a signal wire 818, 828 to one or more multiplexed flip-flop structures (not shown) which are connected to form a datapath and which are clocked using the CLOCK (or GLOBAL CLOCK) and BCLOCK signals. When a single clock tree 830 (e.g., for the master GLOBAL CLOCK signal) is shared across multiple clock regenerator circuits, each regenerator circuit may include its own BCLOCK generator circuit 810, 820. In this way, the clock tree 830 provides the master GLOBAL CLOCK signal to the plurality of multiplexed flip-flop structures, while each BCLOCK generator circuit 810, 820 provides the low speed second clock signal BCLOCK to one or more multiplexed flip-flop structures. In this way, the second clock signal BCLOCK generated during scan mode is a time-shifted and inverted version of the master clock signal CLOCK (or GLOBAL CLOCK), where the time shift is determined by the delay element 812, 822. In an example implementation where the delay element 812 provides a delay of 600 ps and the CLOCK/GLOBAL CLOCK and BCLOCK signals are used to separately clock the master and slave latches during scan mode as described herein, the resulting offset between the CLOCK/GLOBAL CLOCK and BCLOCK signals provides high tolerance for clock skew between the CLOCK/GLOBAL CLOCK and BCLOCK signals as high as 600 ps±250 ps. As a result, the master latch is able to close and hold its data before the slave latch opens to launch its data, even when there is skew between the CLOCK/GLOBAL CLOCK and BCLOCK signals up to the predetermined delay amount.

Figure 9:
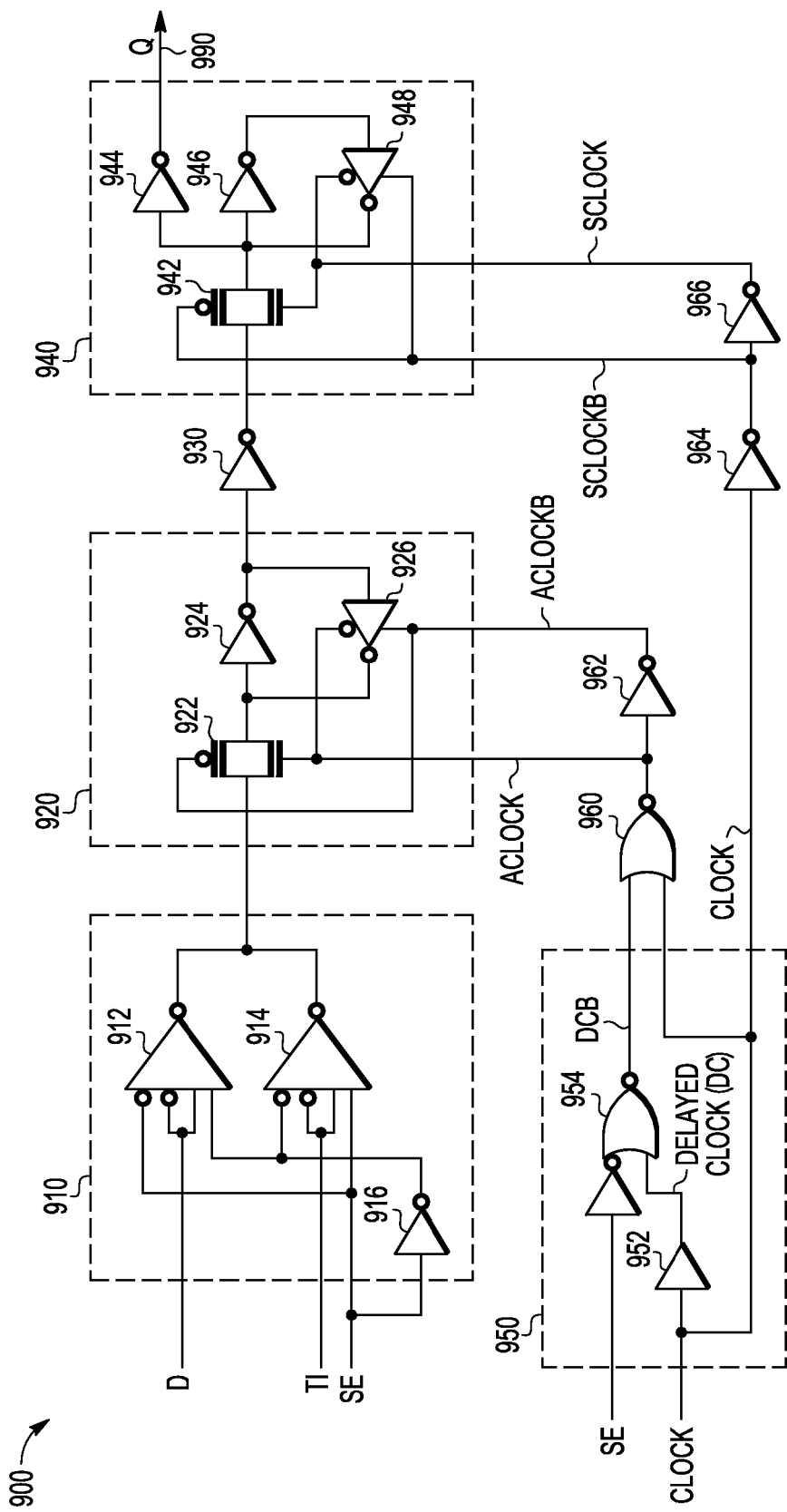
FIG. 9 is a schematic circuit diagram of a multiplexed data flip-flop which has a separately clocked master latch.

While hold time violations may be addressed by generating a separate slave clock signal for clocking the slave latch during scan modes, other embodiments are contemplated where hold time violations are addressed by applying the input clock signal to clock the slave latch for both functional and scan modes while a second clock is generated and applied to clock the master latch of the flip-flop. An example of such an alternative embodiment is shown in FIG. 9 which depicts a schematic circuit diagram of a multiplexed data flip-flop 900 which has a storage cell 920, 940 in which a slave latch 940 is clocked with a slave clock signal SCLOCK during functional and scan modes, but a master latch 920 is separately clocked with a master clock signal ACLOCK which varies during functional and scan modes. In the depicted flip-flop 900, a positive edge triggered implementation is provided where the master latch 920 and slave latch 940 are separately clocked by the clock regenerator circuitry 950.

The depicted multiplexed flip-flop 900 includes an input multiplexer 910 for choosing between functional data input D and scan data input TI based on a control input scan enable SE. The multiplexer 910 uses a functional data inverter 912, scan data inverter 914, and scan control signal inverter 916 to choose between the input functional data D and scan data TI. With scan data TI fed to the inputs of the scan data inverter 914, and functional data D fed to the inputs of the functional data inverter 912, the multiplex select function is controlled by feeding the scan enable signal SE (along with its inverse generated by inverter 916) to both the functional data inverter 912 and scan data inverter 914 as shown. The outputs of the functional data inverter 912 and scan data inverter 914 are tied together to form the output of the multiplexer 910 which is fed to the master latch 920. It will be appreciated that any desired multiplexer circuit design may be used to select between functional data D and scan data TI based on the scan enable (SE) selection signal.

The multiplexer 910 conveys the chosen input to the L1 master latch 920 which is clocked by the master clock signal ACLOCK and its inverse ACLOCKB. The depicted master latch 920 includes a transmission gate 922 which is gated by the ACLOCK and ACLOCKB signals to allow data received from the multiplexer 910 to be passed as shown to a storage node which is formed with inverters 924, 926 and clocked by the master clock signal pair ACLOCK, ACLOCKB. Inverter 930 buffers the storage node and provides the data as an input to the L2 slave latch 940.

The depicted L2 slave latch 940 is clocked by the slave clock signal SCLOCK and its inverse SCLOCKB to launch output data Q on the output 990. The depicted slave latch 940 includes circuitry that receives the output from the inverter 930 at a transmission gate 942 which is gated by the SCLOCK and SCLOCKB signals to allow data from the inverter 930 to be passed through the transmission gate 942 as shown to a storage node formed with inverters 946, 948. Inverter 944 inverts the data from the storage node to its original state to generate a data output signal Q on output line 990.

To separately clock the master and slave latches 920, 940, clock regenerator circuitry 950 is provided for generating a first clock signal CLOCK and a second clock signal DCB which is in a DC state during the functional mode and which switches during the scan mode to be a delayed and inverted version of the first clock signal CLOCK. These signals from the clock regenerator circuitry 950 are provided to data propagation logic circuitry 960 at the flip-flop 900 for generating a separate master clock signal ACLOCK and ACLOCKB.

Figure 10:
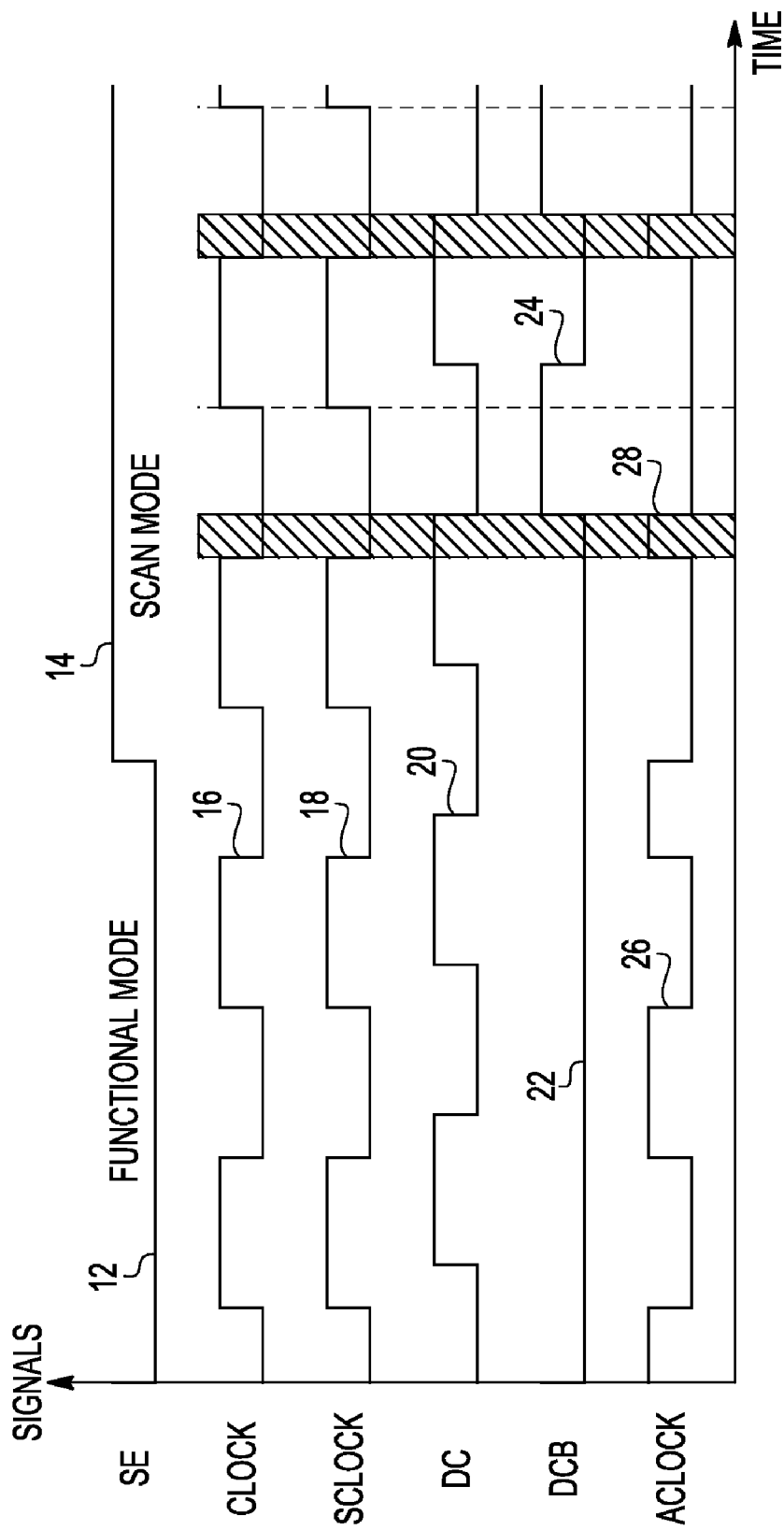
FIG. 10 is a timing diagram of the clock signals for implementing the multiplexed data flip-flop shown in FIG. 9.

To clock the slave latch(es), the clock regenerator circuitry 950 receives and generates (or passes) the first clock signal CLOCK. The first clock signal CLOCK from the clock regenerator circuitry 950 is inverted by the series-connected inverters 964, 966 to generate a first clock pair SCLOCKB, SCLOCK, respectively, for clocking the slave latch 940. Thus, the first clock signal CLOCK is inverted by inverter 964 to generate the SCLOCKB signal, and is inverted again by the inverter 966 to generate the SCLOCK signal. As illustrated in the timing diagrams shown in FIG. 10, the SCLOCK signal 18 tracks the first clock signal CLOCK 16 in both functional and scan modes.

To separately clock the master latch(es), the clock regenerator circuitry 950 includes a NOR gate 954 which receives an inverted version of the scan enable signal SE and a Delayed Clock signal (DC) which is a delayed version of the first clock signal CLOCK generated by the delay element 952. When the scan enable signal SE is "low" during a functional mode and applied in inverted form as an input to the NOR gate 954, the NOR gate 954 generates a fixed "low" output signal DCB, regardless of the status of the CLOCK input. This is depicted with the timing diagrams in FIG. 10 which show that, during functional mode when the SE signal 12 is "low," the NOR gate 954 turns the DCB signal 22 "low." With the DCB signal 22 "low," the NOR gate 960 acts as an inverter so that the input clock signal CLOCK 16 is inverted to generate the master clock signal ACLOCK 26, which in turn is inverted by inverter 962 to generate the master clock signal ACLOCKB. As a result, when the input clock signal CLOCK is "low" during functional mode, the master latch 920 is transparent, but when the input clock signal CLOCK is "high," the master latch 920 is opaque. In this functional mode, data setup in the master latch 920 and data launch in the slave latch 940 both occur at the rising edges of the input clock signal CLOCK.

However, when the scan enable signal SE is "high" during a scan mode and applied in inverted form as an input to NOR gate 954, the NOR gate 954 generates a pulse signal DCB which is an inverted version of the Delayed Clock signal DC, and therefore a delayed and inverted version of the first clock signal CLOCK. The DCB signal which is combined at the NOR gate 960 with the first clock signal CLOCK to generate the master clock signal ACLOCK, and then inverted by the inverter 962 to generate the second master clock signal ACLOCKB for clocking the master latch 920. In this configuration, the NOR gate 960 acts as an interlocking gate during scan mode to combine the first clock signal CLOCK and the DCB signal (the delayed and inverted version of the first clock signal CLOCK) into a master clock signal ACLOCK which clocks the master latch 920 to avoid hold time violations. This is depicted with the timing diagrams in FIG. 10 which show that, during scan mode (when the SE signal 14 is "high"), the clock regenerator circuitry 950 generates the delayed clock signal DCB 24 which is combined with the clock signal CLOCK at NOR gate 960 to form the master clock signal ACLOCK 28 to enable early capture by the master latch.

As seen from the foregoing, the clock regenerator circuitry 950 prevents hold time violations during scan mode that can be caused by the setup and launch delay through latches by generating separate clock signals so that the master latch 920 and the slave latch 940 are separately clocked with two unique phases. The separate clocks allow the master latch 920 to receive data from the multiplexer 910 in a "time-advanced" first phase and then pass the data to the slave latch 940 in the second phase. As a result, the master latch 940 is transparent during scan mode only when the input clock signal CLOCK 16 and the DCB signal 24 are both "low," as indicated in the scan mode portion 28 of the ACLOCK signal in FIG. 10. By controlling the hold time of the master latch 920 with the DCB signal during scan mode so as to be offset with respect to the launch of the slave latch 940, the master latch is clocked with the master clock signal ACLOCK 28 to effect an early data capture that is separated from the launch of the slave latch under control of the SCLOCK signal 18.

As described above with reference to FIGS. 7 and 8, various clock regeneration schemes may be employed to separately generate the master and slave clock signals for the multiplexed flip-flop structures described herein. For example, where a plurality of clock generator circuits are used with a single clock tree in a defined circuit area (such as shown in FIG. 8), each clock generator circuit may include its own copy of the clock regenerator circuitry 950 for generating the second clock signal DCB in response to the input signal CLOCK and a test enable signal SE. Where the clock regenerator circuitry 950 includes a NOR gate which combines an inverted version of the scan enable signal SE and a delayed version of the first clock signal CLOCK generated by a delay element, the delay element may be selected to provide a delay that is function of the process variation or maximum time that is required to latch. In an example implementation, if the delay element provides a delay of 300 ps and the ACLOCK and SCLOCK signals are used to separately clock the master and slave latches during scan mode as described herein, the resulting offset between the ACLOCK and SCLOCK signals provides high tolerance for clock skew between the ACLOCK and SCLOCK signals. As a result, the master latch is able to close and hold its data before the slave latch opens to launch its data, even when there is skew between the ACLOCK and SCLOCK signals up to the predetermined delay amount.

Figure 11:
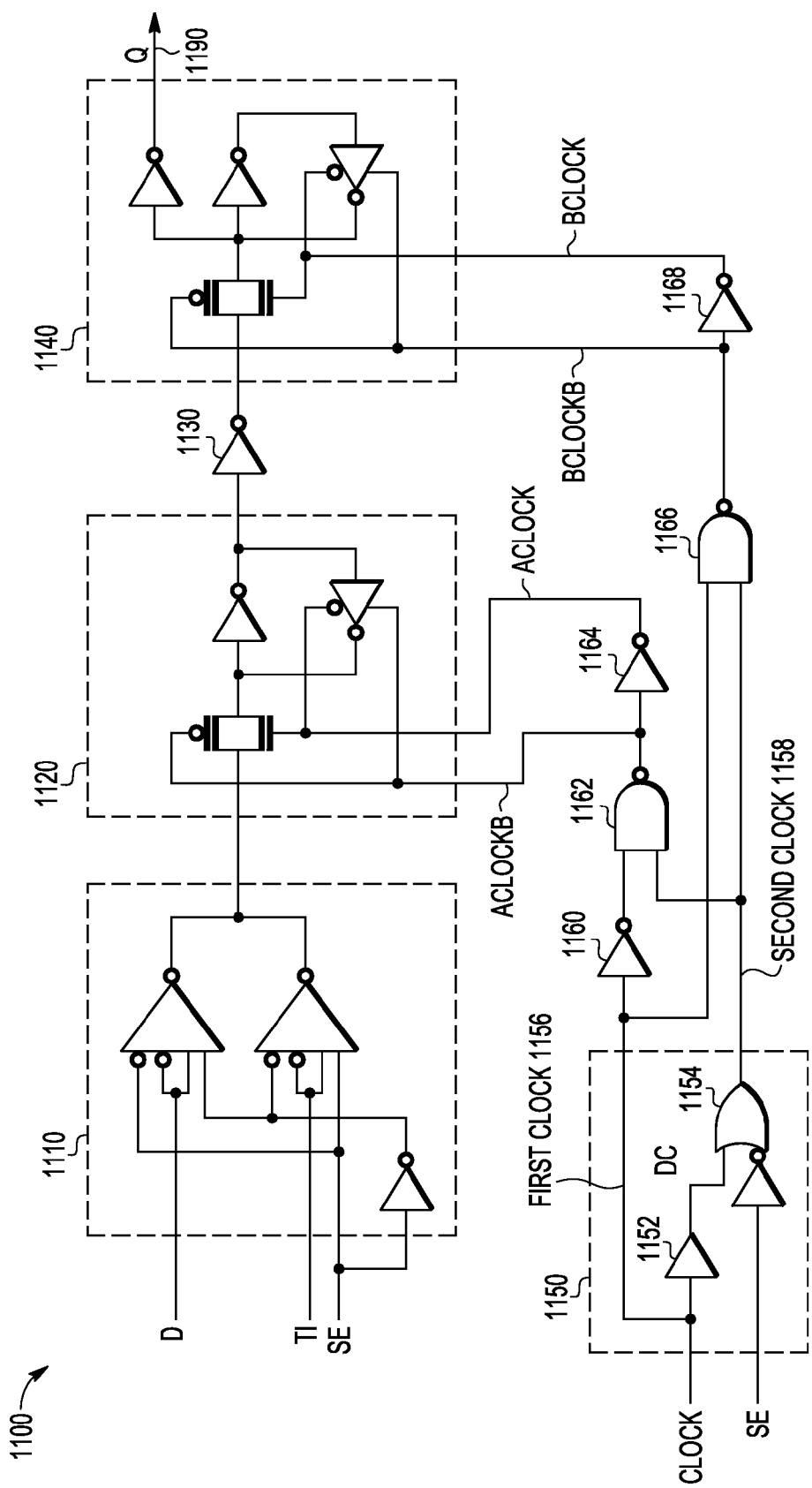
FIG. 11 is a schematic circuit diagram of a multiplexed data flip-flop which has a separately clocked master and slave latches.
Figure 12:
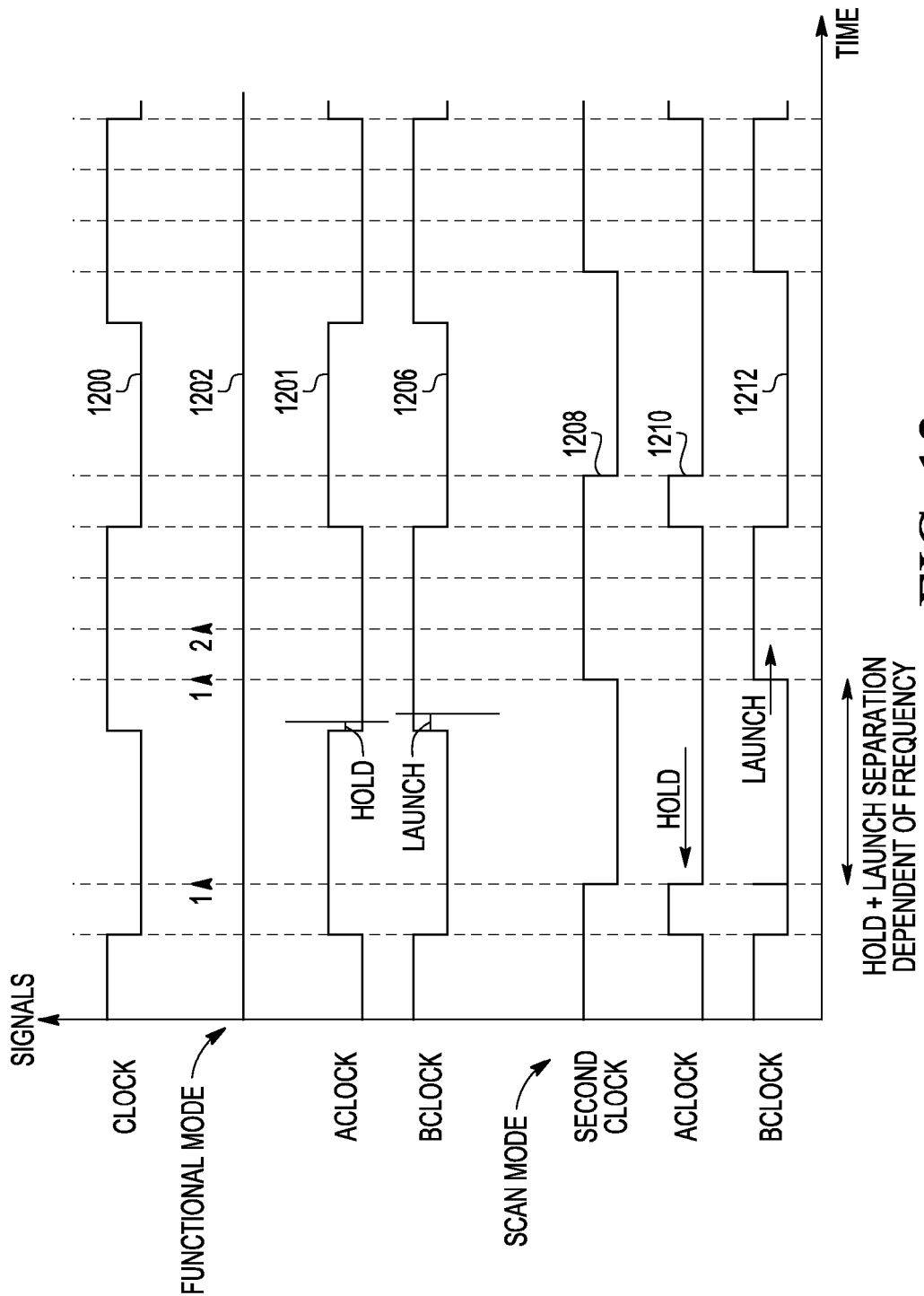
FIG. 12 is a timing diagram of the clock signals for implementing the multiplexed data flip-flop shown in FIG. 11.

As described hereinabove, separately generated master and slave clocks can be used to address hold time violations during scan mode by delaying the data launch transitions of the slave clock relative to the data setup transitions of the master clock, or by advancing the data setup transitions of the master clock relative to the data launch transitions of the slave clock. These approaches may also be combined by deriving separate master and slave clocks from a common input clock signal to provide early master latch capture and delayed slave latch launch. An example of such an alternative embodiment is shown in FIGS. 11 and 12 which depict a schematic circuit diagram and associated timing diagrams of a multiplexed data flip-flop 1100 which has a storage cell 1120, 1140 in which a slave latch 1140 is clocked with a slave clock signal BCLOCK and a master latch 920 is separately clocked with a master clock signal ACLOCK. In the depicted flip-flop 1100, a positive edge triggered implementation is provided where the master latch 1120 and slave latch 1140 are separately clocked by the clock regenerator circuitry 1150. To separately clock the master and slave latches 1120, 1140, clock regenerator circuitry 1150 provides a first clock signal 1156 and a second clock signal 1158. These signals from the clock regenerator circuitry 1150 are provided to data propagation logic circuitry 1160, 1162, 1166 at the flip-flop 1100 for generating a separate master clock signals ACLOCK, ACLOCKB and slave clock signals BCLOCK, BCLOCKB.

During functional modes, the master and slave clock signals ACLOCK, BCLOCK are applied as inverted clocks to the master latch 1120 and slave latch 1140, respectively. However, during scan modes, the master and slave clock signals ACLOCK, BCLOCK are applied to the master latch 1120 and slave latch 1140 so that the master latch 1120 is able to close and hold its data before the slave latch opens to launch its data.

The depicted multiplexed flip-flop 1100 is similar to the Mux-D flip-flops described hereinabove in terms of the design and operation of the multiplexer 1110, master latch 1120, inverter 1130, slave latch 1140 for choosing, latching and outputting functional data input D and scan data input TI based on a control input scan enable SE. However, the master latch 1120 is clocked by the master clock signal ACLOCK and its inverse ACLOCKB, while the slave latch 1140 is closed by the slave clock signal BCLOCK and its inverse BCLOCKB. In addition, a clock regenerator circuitry 1150 is provided for separately clocking the master and slave latches 1120, 1140 by generating a First Clock signal 1156 and a Second Clock signal 1158, which in turn are applied to predetermined clocking logic for generating the master and slave clock signals ACLOCK, ACLOCKB, BCLOCK, and BCLOCKB. To generate the First Clock signal 1156, the clock regenerator circuitry 1150 receives and generates (or passes) the master input clock signal CLOCK. The Second Clock signal 1158 is generated by an OR gate 1154 which receives an inverted version of the scan enable signal SE and a Delayed Clock signal (DC) which is a delayed version of the master input clock signal CLOCK generated by the delay element 1152.

To clock the master latch 1120, the First Clock signal 1156 is applied to predetermined clocking logic in order to generate the master clock signals ACLOCK, ACLOCKB. In particular, the First Clock signal 1156 is inverted by the inverter 1160 and then applied to the NAND gate 1162 which also receives the Second Clock signal 1158 as an input. The output of the NAND gate 1162 is used for the master clock signal ACLOCKB, and is inverted again by the inverter 1164 to generate the master clock signal ACLOCK. In similar fashion, the slave latch 1140 is clocked by applying the First Clock signal 1156 to predetermined clocking logic in order to generate the slave clock signals BCLOCK, BCLOCKB. In particular, the First Clock signal 1156 is applied to the NAND gate 1166 which also receives the Second Clock signal 1158 as an input. The output of the NAND gate 1166 is used for the slave clock signal BCLOCKB, and is inverted again by the inverter 1168 to generate the slave clock signal BCLOCK.

When the scan enable signal SE is "low" during a functional mode and applied in inverted form as an input to OR gate 1154, the OR gate 1154 generates the Second Clock signal 1158 as a fixed "high" output signal, regardless of the status of the CLOCK input. This is depicted with the timing diagrams in FIG. 12 which show that, during functional mode, the OR gate 1154 turns the Second Clock signal 1202 "high," regardless of the status of the CLOCK input 1200. With the Second Clock signal 1202 "high," the NAND gates 1162, 1166 each act as an inverter to their other respective inputs. Thus, in the functional mode, the NAND gate 1162 acts as an inverter to generate the master clock signal ACLOCKB, which in turn is inverted by inverter 1164 to generate the master clock signal ACLOCK 1204. In similar fashion, the NAND gate 1166 receives the "high" Second Clock signal 1202, and therefore acts as an inverter to generate the slave clock signal BCLOCKB, which in turn is inverted by inverter 1168 to generate the slave clock signal BCLOCK 1206. As a result, when the input clock signal CLOCK is "low" during functional mode, the master latch 1120 is transparent, but when the input clock signal CLOCK is "high," the master latch 1120 is opaque. As shown in FIG. 12 with the ACLOCK and BCLOCK timing diagrams 1204, 1206, during the functional mode, data setup in the master latch 1120 and data launch in the slave latch 1140 both occur at the rising edges of the input clock signal CLOCK.

When the scan enable signal SE is "high" during scan mode and applied in inverted form as an input to OR gate 1154, the OR gate 1154 generates the Second Clock signal 1158 as delayed clock signal DC, which is a delayed version of the CLOCK input. This is depicted in FIG. 12 which shows that, during scan mode, the Second Clock signal 1208 generated by the OR gate 1154 follows the CLOCK input 1200 by a predetermined delay. To clock the master latch 1120, the First and Second Clock signals 1156, 1158 are combined at the NAND gate 1162. In particular, the inverted version of the First Clock signal 1156 (from inverter 1160) is combined with the Second Clock signal 1158 to generate the master clock signal ACLOCKB, which is then inverted by inverter 1164 to generate the master clock signal ACLOCK. This is shown in FIG. 12 with the ACLOCK signal 1210 which represents the output from inverter 1164, which is the inverted NAND combination of the Second Clock signal 1208 and the output from inverter 1160 (which inverts the First Clock signal 1200). As a result, the master latch 1120 is transparent only when the Second Clock signal 1208 and the inverted First Clock signal is "high," meaning that the hold time of the master latch 1120 is controlled by the Second Clock signal 1208.

The slave latch 1140 is clocked during scan mode in a similar fashion by combining the First and Second Clock signals 1156, 1158 at the NAND gate 1166. In particular, NAND gate 1166 receives the First Clock signal 1156 and the Second Clock signal 1158, and generates therefrom the slave clock signal BCLOCKB, which is then inverted by inverter 1168 to generate the master clock signal BCLOCK. This is shown in FIG. 12 with the BCLOCK signal 1212 which represents the output from inverter 1168, which is the inverted NAND combination of the Second Clock signal 1208 and the First Clock signal 1200. As a result, the slave latch 1140 is transparent only when the Second Clock signal 1208 and the inverted First Clock signal is "high," meaning that the launch of the slave latch 1140 is controlled by the Second Clock signal 1208. When combined with the separate clocking of the master latch 1120 by the master clock signals ACLOCK, ACLOCKB, the falling edge of the Second Clock signal 1208 is used to control the hold time of the master latch 1120, while the rising edge of the Second Clock signal 1208 controls the launch of the slave latch 1140 so that both are separated by half a cycle and frequency dependent. By enabling early capture at the master latch(es) and delayed launch at the slave latch(es), the separated clocking scheme may advantageously be used to perform debug testing on various datapaths.

By now, it should be appreciated that there has been provided herein a data storage circuit and method of operation that allows clocked storage elements in a datapath to propagate data without hold time violations during scan mode. In selected embodiments, the flip-flop circuit is implemented as a multiplexed data flip-flop which includes a multiplexer for receiving functional data and scan data inputs and generating a multiplexer output signal under control of a scan enable signal. The multiplexer output signal is provided to a master latch for generating a master latch output signal at a hold time under control of a master clock signal. The master latch output signal is provide to a slave latch for generating a flip flop output signal at a launch time under control of a slave clock signal. To control the master and slave latches, clock generation circuitry is provided for receiving a first clock signal and generating therefrom a second clock signal that has a DC state during a functional mode and has a switching state during a scan mode. In addition, data propagation logic circuitry is provided which uses said first and second clock signals to generate the master and slave clock signals during a scan mode to delay data launch at the slave latch with respect to the data capture at the master latch, and to generate the master and slave clock signals during a functional mode so that data launch time at the slave latch coincides with the data capture at the master latch. In operation, the data propagation logic circuitry generates master and slave clock signals which provide the flip-flop circuit with multiplexed data flip-flop behavior during the functional mode and with level-sensitive scan design behavior during the scan mode. For example, in selected embodiments a separate slave clock signal is generated by the clock generation circuitry which generates the second clock signal as steady state signal during the functional mode, and during the scan mode as an inverted version of the first clock signal but having signal transitions in a first direction (e.g., rising edges) that are time shifted by a predetermined time interval from the signal transitions in a second opposite direction (e.g., falling edges) at the first clock signal. An example circuit configuration of such a clock generation circuit includes a delay element for generating a delayed clock signal from the first clock signal; a NOR gate coupled to receive the first clock signal and the delayed clock signal and to generate therefrom a NOR output signal; and an OR gate coupled to receive the NOR output signal and an inverted version of the scan enable signal and to generate therefrom the second clock signal. Another example circuit configuration of the clock generation circuit includes a delay element coupled to generate a delayed clock signal from the first clock signal, and an OR gate coupled to receive the delayed clock signal and an inverted version of the scan enable signal and to generate therefrom the second clock signal. With this arrangement, the data propagation logic circuitry applies an inverted version of the first clock signal to the slave latch during the functional mode and applies the second clock signal to clock the slave latch during the scan mode so as to delay data launch at the slave latch with respect to data capture at the master latch. An example circuit configuration of such a data propagation logic circuit includes a NAND gate coupled to receive the first and second clock signals and to generate therefrom the slave clock signal. In other embodiments, a separate master clock signal is generated by the clock generation circuitry which generates the second clock signal as steady state signal during the functional mode, and during the scan mode as a time-shifted version of the first clock signal. An example circuit configuration of such a clock generation circuit includes a delay element that is coupled to generate a delayed clock signal from the first clock signal; and a NOR gate coupled to receive the delayed clock signal and an inverted version of the scan enable signal, and to generate therefrom the second clock signal. With this arrangement, the data propagation logic circuitry applies an inverted version of the first clock signal to the master latch during the functional mode and applies the second clock signal to clock the master latch during the scan mode so as to adjust (e.g., shorten) the hold time of the master latch, such as by advancing data capture at the master latch with respect to data launch at the slave latch. Alternative, the data propagation logic circuitry applies an inverted version of the first clock signal to the slave latch during the scan mode so as to advance data capture at the master latch with respect to data launch at the slave latch. An example circuit configuration of such a data propagation logic circuit includes a NOR gate coupled to receive the first and second clock signals and to generate therefrom the master clock signal. As described, a flip-flop circuit may be formed with the multiplexer, master latch, slave latch, and data propagation logic circuitry, alone or in combination with the clock generation circuitry.

In another form, there is provided a method for operating a master latch which is connected in series with a slave latch using a single input clock to provide multiplexed data flip flop (MUX DFF) behavior during a functional mode and level sensitive scan design (LSSD) behavior during a scan mode. In the disclosed method, a single input clock and an inverted version of the single input clock are applied during the functional mode to clock the master and slave latches. However, during the scan mode, the single input clock and a second clock generated from the single input clock are applied to generate master and slave clocks for clocking the master and slave latches, whereby the slave clock has a non-overlapping periodic signal transition edge in a first direction that is delayed with respect to a periodic signal transition edge in a second opposite direction of the master clock. In selected embodiments, the single input clock and the second clock are applied during the scan mode by applying the single input clock to clock the master latch and applying the second clock to clock the slave latch so that the second clock has a periodic rising edge that is delayed with respect to a periodic falling edge of the single input clock. For example, the single input clock may be applied to clock the master latch by inverting the single input clock with an inverter, and the second clock may be applied to clock the slave latch by applying the second clock and the single input clock to a NAND gate which generates the slave clock (or an inverted version thereof). In other embodiments, the single input clock and the second clock are applied during the scan mode applying the single input clock to clock the slave latch and applying the second clock to clock the master latch so that the single input clock has a periodic rising edge that is delayed with respect to a periodic falling edge of the second clock. For example, the single input clock may be applied to clock the salve latch by inverting the single input clock with an inverter, and the second clock may be applied to clock the master latch by applying the second clock and the single input clock to a NOR gate which generates the master clock (or an inverted version thereof). In this way, the master and slave clocks may be applied to clock the master and slave latches during scan mode so that the slave latch launch is delayed with respect to the master latch closing.

In yet another form, there is provided a system, apparatus and methodology for propagating data in a datapath. As disclosed, a plurality of clocked data storage elements are arranged in a datapath and operable to receive input functional data or scan data under control of a scan enable signal and to generate output data therefrom. For example, the clocked data storage elements may be configured as edge-triggered multiplexed data flip-flop latches. A clock generator is provided which receives a first clock signal and generates therefrom a non-overlapping second clock signal as a steady state signal during a functional mode and as a switching clock signal during a scan mode, where the switching clock signal during the scan mode has signal transitions in a first direction that are time shifted by a predetermined time interval from signal transitions in a second opposite direction at the first clock signal. In addition, data propagation logic circuitry is provided that is operable to use the first clock signal to cause functional data to propagate through the clocked data storage elements during a functional mode, and that is operable to use the first clock signal and the non-overlapping second clock signal to cause scan data to propagate through the clocked data storage elements during a scan mode to prevent or inhibit hold time violations from occurring at the clocked data storage elements.

Although the described exemplary embodiments disclosed herein are directed to various clocking schemes for use with multiplexed data flip-flop structures to enable a data propagation through a datapath, the present invention is not necessarily limited to the example embodiments which illustrate inventive aspects of the present invention that are applicable to a wide variety of latch devices, manufacturing methods and operational methodologies. For example, the example clock regenerator circuitry 350, 550, 850, 1150 is depicted in the drawings alongside a single flip-flop formed with a pair of separately clocked master and slave latches for illustration purposes and clarity of explanation, but it will be appreciated that the clock regenerator circuitry may be shared across a bank of separately clocked flip-flops (e.g., in a data path), and need not be part of the actual flip-flop. In addition, the clock regenerator circuit may be implemented with different logic circuitry, depending on whether a negative edge triggered flip-flop implementation or positive edge triggered flip-flop implementation is used. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The term "coupled," as used herein, is not intended to be limited to a direct coupling or a mechanical coupling. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A data storage circuit, comprising:
    a multiplexer for receiving functional data and scan data inputs and generating a multiplexer output signal under control of a scan enable signal;
    a master latch for generating a master latch output signal from said multiplexer output signal at a hold time under control of a master clock signal;
    a slave latch for generating a flip flop output signal from said master latch output signal at a launch time under control of a slave clock signal;
    clock generation circuitry for receiving a first clock signal and generating therefrom a second clock signal that has a DC state during a functional mode and has a switching state during a scan mode; and
    data propagation logic circuitry operable to use said first and second clock signals to generate the master and slave clock signals during a scan mode to delay data launch at the slave latch with respect to data capture at the master latch, and to generate the master and slave clock signals during a functional mode so that data launch at the slave latch coincides with data capture at the master latch.

2. The data storage circuit of claim 1, where the data propagation logic circuitry generates master and slave clock signals which provide the flip-flop circuit with multiplexed data flip-flop behavior during the functional mode and with level-sensitive scan design behavior during the scan mode.

3. The data storage circuit of claim 1, where the clock generation circuitry generates the second clock signal during the scan mode as an inverted version of the first clock signal but having signal transitions in a first direction that are time shifted by a predetermined time interval from signal transitions in a second opposite direction at the first clock signal.

4. The data storage circuit of claim 1, where the data propagation logic circuitry applies an inverted version of the first clock signal to the slave latch during the functional mode and applies the second clock signal to clock the slave latch during the scan mode so as to delay data launch at the slave latch with respect to data capture at the master latch.

5. The data storage circuit of claim 1, where the clock generation circuitry comprises:
    a delay element coupled to generate a delayed clock signal from the first clock signal;
    a NOR gate coupled to receive the first clock signal and the delayed clock signal and to generate therefrom a NOR output signal;
    an OR gate coupled to receive the NOR output signal and an inverted version of the scan enable signal and to generate therefrom the second clock signal.

6. The data storage circuit of claim 1, where the clock generation circuitry comprises:
    a delay element coupled to generate a delayed clock signal from the first clock signal; and
    an OR gate coupled to receive the delayed clock signal and an inverted version of the scan enable signal and to generate therefrom the second clock signal.

7. The data storage circuit of claim 6, where the data propagation logic circuitry comprises a NAND gate coupled to receive the first and second clock signals and to generate therefrom the slave clock signal.

8. The data storage circuit of claim 1, where the clock generation circuitry generates the second clock signal during the scan mode to be time-shifted by a predetermined time interval with respect to said first clock signal.

9. The data storage circuit of claim 1, where the data propagation logic circuitry applies an inverted version of the first clock signal to the master latch during the functional mode and applies the second clock signal to clock the master latch during the scan mode so as to advance data capture at the master latch with respect to data launch at the slave latch.

10. The data storage circuit of claim 9, where the data propagation logic circuitry applies an inverted version of the first clock signal to the slave latch during the scan mode so as to advance data capture at the master latch with respect to data launch at the slave latch.

11. The data storage circuit of claim 8, where the clock generation circuitry comprises:
    a delay element coupled to generate a delayed clock signal from the first clock signal; and
    a NOR gate coupled to receive the delayed clock signal and an inverted version of the scan enable signal, and to generate therefrom the second clock signal.

12. The data storage circuit of claim 11, where the data propagation logic circuitry comprises a NOR gate coupled to receive the first and second clock signals and to generate therefrom the master clock signal.

13. The data storage circuit of claim 1, where the multiplexer, master latch, slave latch, and data propagation logic circuitry comprise a flip-flop circuit.

14. The data storage circuit of claim 1, where the multiplexer, master latch, slave latch, clock generation circuitry, and data propagation logic circuitry comprise a flip-flop circuit.

15. A method for operating a master latch which is connected in series with a slave latch using a single input clock to provide multiplexed data flip flop (MUX DFF) behavior during a functional mode and level sensitive scan design (LSSD) behavior during a scan mode, comprising:
    applying, during the functional mode, the single input clock and an inverted version of the single input clock to clock the master and slave latches; and
    applying, during the scan mode, the single input clock and a second clock generated from the single input clock to generate master and slave clocks for clocking the master and slave latches, whereby the slave clock has a non-overlapping periodic signal transition edge in a first direction that is delayed with respect to a periodic signal transition edge in a second opposite direction of the master clock.

16. The method of claim 15, where applying, during the scan mode, the single input clock and the second clock comprises applying the single input clock to clock the master latch and applying the second clock to clock the slave latch so that the second clock has a periodic rising edge that is delayed with respect to a periodic falling edge of the single input clock.

17. The method of claim 15, where applying, during the scan mode, the single input clock and the second clock comprises applying the single input clock to clock the slave latch and applying the second clock to clock the master latch so that the single input clock has a periodic rising edge that is delayed with respect to a periodic falling edge of the second clock.

18. The method of claim 15, where the master and slave clocks are applied to clock the master and slave latches during the scan mode so that the slave latch launch is delayed with respect to the master latch closing.

19. A system for propagating data in a datapath, comprising:
  a plurality of clocked data storage elements arranged in a datapath and operable to receive input functional data or scan data under control of a scan enable signal and to generate output data therefrom;
  a clock generator which receives a first clock signal and generates therefrom a non-overlapping second clock signal as a steady state signal during a functional mode and as a switching clock signal during a scan mode, where the switching clock signal during the scan mode has signal transitions in a first direction that are time shifted by a predetermined time interval from signal transitions in a second opposite direction at the first clock signal; and
  data propagation logic circuitry operable to use said first clock signal to cause functional data to propagate through said clocked data storage elements during a functional mode, and operable to use the first clock signal and the non-overlapping second clock signal to cause scan data to propagate through said clocked data storage elements during a scan mode to inhibit hold time violations from occurring at the clocked data storage elements.

20. A system of claim 19, wherein said plurality of clocked data storage elements are configured as edge-triggered multiplexed data flip-flop latches.

* * * * *